United States Patent [19]

Sherwin

[11] 4,112,477

[45] Sep. 5, 1978

[54] CIRCUIT FOR ENERGIZING A FUEL INJECTOR VALVE COIL

[75] Inventor: Walter M. Sherwin, Detroit, Mich.

[73] Assignee: General Motors Corporation, Detroit, Mich.

[21] Appl. No.: 803,744

[22] Filed: Jun. 6, 1977

[51] Int. Cl.² .................................................. H01H 47/32
[52] U.S. Cl. .................................... 361/155; 361/156
[58] Field of Search ................ 361/154, 155, 156, 194

[56] References Cited

U.S. PATENT DOCUMENTS

| 3,140,428 | 7/1964 | Shepard, Jr. | 361/156 |
| 3,374,402 | 3/1968 | Derc | 361/156 X |

Primary Examiner—Harry E. Moose, Jr.

Attorney, Agent, or Firm—Howard N. Conkey

[57] ABSTRACT

A circuit for energizing a fuel injector valve coil in response to a fuel injection pulse including a storage capacitor which is charged from a relatively high voltage source and which is discharged through the fuel injector valve coil through a controlled rectifier gated conductive upon the initiation of a fuel injection pulse signal. The charging circuit for the capacitor is disabled upon initiation of capacitor discharge for a time period at least greater than the time for the capacitor discharge current to decrease to a value to effect commutation of the controlled rectifier after which capacitor charging is reinitiated. A holding circuit is provided for holding the fuel injector valve coil energized for the duration of the fuel injection pulse signal.

3 Claims, 1 Drawing Figure

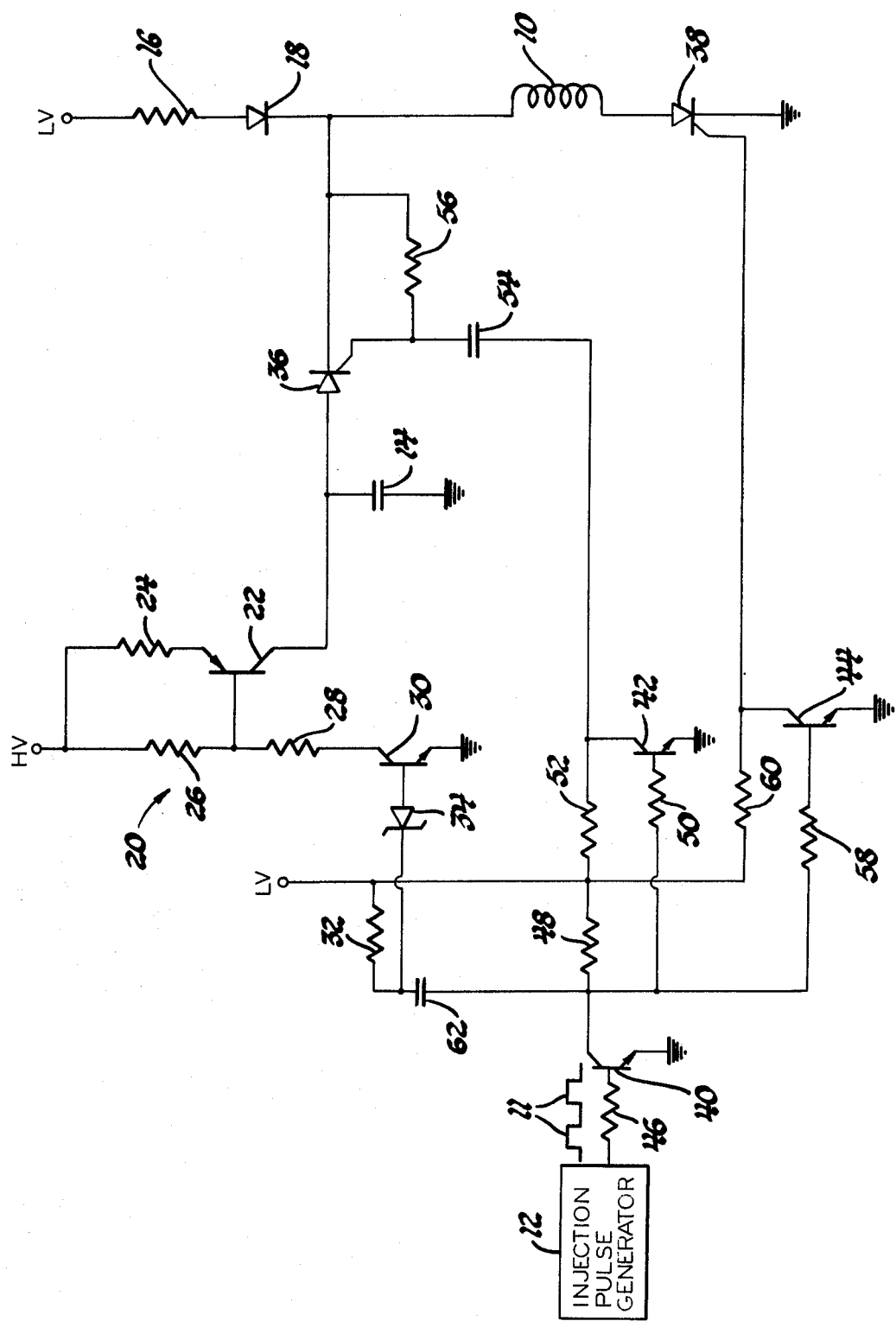

CIRCUIT FOR ENERGIZING A FUEL INJECTOR VALVE COIL

This invention is directed toward an energizing circuit for a fuel injector valve coil.

Fuel injection systems employing various numbers of injectors for supplying the total fuel requirements of an internal combustion engine are known. For purposes of economy and other reasons, it is desirable in some systems to employ the minimum possible number of injectors for supplying the total fuel requirements of the internal combustion engine. When one or two injectors are used, they must be capable of providing precisely measured amounts of fuel over widely varying conditions of operation of the engine. The injector must be capable of supplying a large amount of fuel at the maximum speed and loading conditions of the vehicle while also being capable of supplying small amounts of fuel at engine idle conditions. However, when an injector is sized to provide the quantity of fuel required at the maximum speed and loading conditions, it becomes difficult to achieve precise fuel metering at the low fuel requirement conditions of the vehicle engine since injector driver circuits are generally incapable of controlling the injector so as to provide the required narrow fuel pulse width.

It is the general object of this invention to provide an improved fuel injector valve coil driver circuit.

It is another object of this invention to provide an improved drive circuit for a fuel injector valve drive coil which is effective to provide improved turn-on and turn-off transients of the fuel injector to thereby improve the precision and repeatability of the fuel metering by the fuel injector.

It is another object of this invention to provide a capacitor discharge energizing circuit for a fuel injector valve coil wherein a capacitor is charged from a relatively high voltage source and wherein the charge time of the capacitor is maximized.

It is another object of this invention to provide a capacitor discharge energizing circuit for the fuel injector valve coil wherein a capacitor is charged from a relatively high voltage source and wherein the charge time of the capacitor is independent of the duration of fuel injection pulses provided for controlling the duration of fuel injection.

It is another object of this invention to provide a circuit for energizing a fuel injector valve coil in response to injection pulses including a capacitor discharge energizing circuit having a capacitor charged from a relatively high voltage source and discharged through the injector coil upon initiation of an injection pulse and also including a holding circuit for maintaining the injector valve coil energized for the duration of the injection pulse wherein the charging time of the capacitor is independent of the duration of the injection pulses.

These and other objects of this invention are accomplished by means of an energizing circuit which includes a storage capacitor charged from a relatively high voltage source and then discharged through the injector coil by a controlled rectifier which is gated conductive upon the initiation of a fuel injection pulse signal. The relatively high level capacitor discharge current effects rapid energization of the fuel injector valve coil to provide initiation of the metering of fuel to the internal combustion engine. The charging circuit is disabled by a timing circuit for a time period required for the capacitor discharge current to decrease to a level to commutate the controlled rectifier. Thereafter, the charging circuit is enabled to again charge the capacitor independent of the duration of the fuel injection pulse signal. A holding circuit is provided to maintain the fuel injector valve coil energized for the duration of the fuel injection pulse signal.

The invention may be best understood by reference to the following description of a preferred embodiment and the drawing which is a circuit diagram illustrating the preferred embodiment of the invention.

Referring to the drawing, there is illustrated a circuit for energizing a fuel injector valve coil 10 of a conventional fuel injector operative to supply fuel to an internal combustion engine. The coil 10 is effective to control the fuel injector valve such that when the injector coil 10 is energized, the fuel injector valve is opened to supply fuel to the internal conbustion engine with the quantity of fuel supplied being determined by the duration of the energization of the injector coil 10. The injector coil 10 is energized in response to the injection pulse signals 11 generated by an injection pulse generator 12.

The injection pulse generator 12 is responsive to selected vehicle operating parameters such as engine speed and loading to provide an injection pulse signal 11 having a duration representing a desired quantity of fuel to be metered to the internal combustion engine by the fuel injector valves. The circuit of this invention is responsive to the injection pulses 11 provided by the injection pulse generator 12 to energize the injector coil 10 in a manner so as to provide a rapid energization and deenergization of the injector coil 10 to provide precisely measured amounts of fuel over the entire range of fuel requirements of the internal combustion engine.

The injector coil 10 is energized by current supplied from two sources. The first source is the discharge current of a capacitor 14 which functions to provide the initial rapid energization of the injection coil 10 and the second source is provided by a low voltage supply LV which is coupled to the injector coil 10 through a resistor 16 and a diode 18. The current supplied by the low voltage supply LV functions to provide a holding current for maintaining the injector coil 10 energized after its initial energization by the discharge current of the capacitor 14.

A high voltage supply HV is provided which supplies current for the charging capacitor 14 through a charging circuit 20. The charging circuit 20 includes a PNP transistor 22 having its collector coupled to one side of the capacitor 14, the other side of which is grounded. The emitter of the transistor 22 is coupled to the high voltage source HV through a resistor 24. A base bias circuit for the transistor 22 is provided by a resistor 26, a resistor 28 and an NPN transistor 30 series coupled between the high voltage source HV and ground. The base of the transistor 30 is coupled to the low voltage source LV through a resistor 32 and a Zener diode 34 whose anode is coupled to the base of the transistor 30. When the voltage across the Zener diode 34 exceeds its breakdown voltage, the transistor 30 is biased conductive to bias the transistor 22 conductive which supplies a relatively constant current for charging the capacitor 14. When the voltage across the Zener diode is less than its breakdown voltage, the transistor 30 is biased nonconductive which in turn biases the transistor 22 nonconductive. When the transistor 22 is nonconductive, the charging circuit is ineffective for charging the capacitor 14.

The energization of the injector valve coil 10 is controlled by a pair of switching devices illustrated in the preferred embodiment as gate controlled devices 36 and 38. The gate controlled device 36 takes the form of a controlled rectifier which is biased conductive when a signal is applied to its gate electrode and which is commutated off when the current therethrough decreases to below its predetermined holding current level. The gate controlled device 38 takes the form of a gate turn-off device which conducts only during the time period that a signal is applied to its gate electrode. At all other times, the gate controlled device 38 is nonconductive. When the controlled rectifier 36 and the gate turn-off device 38 are both simultaneously conducting, the capacitor 14 is coupled across the injector valve coil 10. Also, conduction of the gate turn-off device 38 is effective to couple the low voltage source LV across the injector valve coil 10.

The switching devices 36 and 38 are each controlled by a control logic section comprised of the NPN transistors 40, 42 and 44. The injection pulse signals 11 provided by the injection pulse generator 12 are coupled to the base electrode of the transistor 40 through a resistor 46. The collector of the transistor 40 is coupled to the low voltage supply LV through a resistor 48 and the emitter thereof is grounded. The transistor 40 functions to both invert and square the injection pulse signals 11 from the injection pulse generator 12. The resulting signal output is provided at the collector of the transistor 40 which is coupled to the base of the transistor 42 through a resistor 50.

The collector of the transistor 42 is coupled to the low voltage supply LV through a resistor 52 and is also coupled to the gate of the controlled rectifier 36 through a capacitor 54. A resistor 56 is coupled between the gate and cathode of the controlled rectifier 36 across which a voltage signal is developed when the transistor 42 is shifted from a conducting to a nonconducting condition. In this respect, the transistor 42 is normally biased conductive, when the transistor 40 is nonconductive, by the current coupled to its base from the low voltage supply LV through the resistors 48 and 50 which is the condition that exists in the absence of an injection pulse signal 11 from the injection pulse generator 12.

Upon the generation of an injection pulse signal 11 from the generator 12, the transistor 40 is biased conductive to bias the transistor 42 nonconductive. This results in a current pulse that is coupled through the capacitor 54 and the resistor 58 to provide a turn-on voltage for the controlled rectifier 36. Upon termination of the current pulse through the capacitor 54, controlled rectifier 36 continues to conduct until it is commutated off by the current therethrough decreasing to below its hold-in current.

The collector of the transistor 40 is also coupled to the base of the transistor 44 through a resistor 58. The emitter of the transistor 44 is grounded and the collector thereof is coupled to the low voltage supply LV through a resistor 60 and also to the gate electrode of the gate turn-off device 38. In the same manner as the transistor 42, the transistor 44 is biased from a conducting state to a nonconducting state upon the generation of an injection pulse signal 11 from the injection pulse generator 12. Upon termination of the injection pulse signal 11, the transistor 44 is again biased conductive.

During the period that the transistor 44 is biased conductive, which coincides with the injection pulse signal 11, a voltage signal is applied to the gate of the gate turn-off device 38 which is biased conductive for the duration of the injection pulse signal 11.

A reactance controlled timing circuit is provided for disabling the charging circuit 20 for a predetermined time period following the generation of an injection pulse signal 11 by the injection pulse generator 12. The reactance element in the timing circuit is a capacitor 62 which is coupled between the collector electrode of the transistor 40 and the cathode of the Zener diode 34.

Assuming the capacitor 62 is charged by the low voltage supply LV, the Zener diode 34 conducts and the transistor 30 is biased conductive to enable the charging circuit 20 to charge the capacitor 14. In this condition, the capacitor 62 has the voltage of the Zener diode 34 on one side thereof and has a voltage on the other side thereof determined primarily by the resistors 48 and 58. Upon the generation of a fuel injection pulse signal 11, the transistor 40 is biased conductive to abruptly shift the voltage on the capacitor 62 at the collector of the transistor 40 to ground potential. The voltage at the cathode of the Zener diode abruptly shifts by the same amount so that the Zener diode 34 no longer conducts current to the base of the transistor 30. Consequently, the transistors 30 and 22 are biased nonconductive to terminate the charging of the capacitor 14. The capacitor 62 immediately begins to charge from the low voltage supply LV through the resistor 32 and the transistor 40. When the voltage charge exceeds the breakdown voltage of the Zener diode 34, the Zener diode 34 again conducts to bias the transistors 30 and 22 conductive to activate charging of the capacitor 14.

The time constant of the timing circuit including the resistor 32 and the capacitor 62 is such that the time required for the capacitor 62 to charge to the level of the Zener diode 34 after initiation of an injection pulse signal 11 is just greater than the time required for the discharge current of the capacitor 14 through the injector coil 10 when the controlled rectifier 36 and the gate turn-off device 38 are biased conductive to decrease to below the hold-in current level of the controlled rectifier 36 so as to effect commutation thereof. In this manner, the capacitor 14 can be recharged while the injection pulse signal 11 is still being provided by the generator 12.

The operation of the circuit in the drawing will now be described with the initial conditions as follows: No fuel injection pulse signal 11 is being provided by the generator 12, the transistors 22 and 30 are in their conductive condition, the capacitor 14 is charged to the voltage level of the high voltage supply HV and the controlled rectifier 36 and the gate turn-off device 38 are nonconductive so that the fuel injector valve coil 10 is deenergized.

Upon the generation of a fuel injection pulse signal 11 by the generator 12 in response to selected vehicle operating parameters such as, speed, loading and crankshaft positions, the transistor 40 is biased conductive to simultaneously bias the transistors 42 and 44 nonconductive. The voltage pulse across the resistor 56 resulting from the current through the differentiating capacitor 54 is effective to gate the controlled rectifier 36 conductive. At the same time, the voltage pulse at the collector of the transistor 44 is effective to gate the gate turn-off device 38 conductive. The abrupt voltage drop at the cathode of the Zener diode 34 when the transistor 40 switches conductive results in the transistor 30 being biased nonconductive as previously described to bias the transistor 22 nonconductive. Consequently, the charging circuit 20 is disabled and ineffective to supply charging current to the capacitor 14.

Conduction of the controlled rectifier 36 and the gate turn-off device 38 is effective to couple the charged capacitor 14 across the fuel injector valve coil 10. The resulting high current discharge of the capacitor 14 is effective to abruptly energize the injector valve coil 10 to initiate the injection of fuel to the internal combustion engine. The high voltage charge on the capacitor 14 and resulting high current discharge through the coil 10 minimizes the turn-on time of the injector valve.

Even though the current pulse through the capacitor 54 is terminated, the controlled rectifier 36 continues to conduct until such time that the discharge current of the capacitor 14 decreases to below the hold-in current of the controlled rectifier 36. At this time, the controlled rectifier 36 is commutated off and remains nonconductive until the initiation of a subsequent fuel injection pulse signal 11 by the generator 12. As previously indicated, the values of the resistor 32 and the capacitor 62 in the timing circuit is made such that the time constant of the timing circuit is sufficient to disable the charging circuit 20 for a time duration just sufficient to allow the discharge current of the capacitor 14 to decrease to the commutation level of the controlled rectifier 36. In this manner, the charging circuit 20 cannot operate to prevent commutation of the controlled rectifier 36. Thereafter, the capacitor 62 is charged to the breakdown voltage of the Zener diode 34 which conducts to bias the transistors 30 and 22 conductive to reinitiate charging of the capacitor 14. The charging circuit 20 is enabled to charge the capacitor 14 toward the high voltage level HV until the initiation of the subsequent fuel injection pulse signal by the injection pulse generator 12. This permits the capacitor 14 to be recharged while the injector valve coil 10 is still energized and thereby provides maximum charging time for the capacitor 14 with the charging time being independent of the duration of the injection pulse signals 11 provided by the injection pulse generator 12. Maximizing the charge time in this manner is of significant importance particularly at high engine speeds where the maximum available charge time becomes small.

The conduction of the gate turn-off device 38 during the injection pulse signal 11 enables the low voltage holding circuit including the low voltage supply LV, the resistor 18 and the diode 18 to supply a holding current to the injector valve coil 10. When the controlled rectifier 36 and the gate turn-off device 38 are first gated conductive, the voltage charge across the capacitor 14 is greater than the voltage value of the low voltage supply LV. The diode 18 is therefore reverse biased and functions to prevent discharge of the capacitor 14 into the low voltage supply LV. When the voltage across the capacitor decreases to below the voltage value of the low voltage supply LV, the diode 18 conducts so that a holding current is provided for maintaining the injector valve coil 10 energized after the controlled rectifier is commutated.

Upon termination of the fuel injection pulse signal 11 by the generator 12, the transistors 42 and 44 are biased nonconductive resulting in the gate turn-off device 38 being turned off. Turning off the gate turn-off device 38, which has the capability of blocking or sustaining very high voltages without conduction, results in rapid deenergization of the winding 10 to terminate the injection of fuel to the internal combustion engine. In this manner, a precisely measured amount of fuel is provided to the internal combustion engine in response to the fuel injection pulse 11 provided by the injection pulse generator 12.

The above description of a preferred embodiment of the invention for the purpose of illustrating the principles thereof is not to be considered as limiting or restricting the invention, since many modifications may be made by the exercise of skill in the art without departing from the scope of the invention.

I claim:

1. A circuit for energizing a fuel injector valve coil in response to fuel injection pulses to provide measured amounts of fuel to an internal combustion engine, the circuit comprising:

a storage capacitor;

a charging circuit including a relatively high voltage source and a first switch means in series effective to charge the storage capacitor;

a capacitor discharge circuit, the discharge circuit including a second switch means responsive to the initiation of a fuel injection pulse effective to discharge the capacitor through the injector valve coil to affect abrupt injection valve opening and also effective to terminate capacitor discharge when the capacitor discharge current decreases to a predetermined value which is reached after valve opening occurs;

means including a reactive timing element responsive to the initiation of the fuel injection pulse effective to control the first switch means to disable the charging circuit for a predetermined time period required for the capacitor discharge current to decrease to said predetermined value at which the capacitor discharge is terminated, the charging circuit being effective after said predetermined time period to activate capacitor charging; and a holding circuit responsive to the injection pulse effective to maintain the injector coil energized for the duration of the injection pulse, the activation of the capacitor charging being independent from the energization of the injector coil by the holding circuit so that the capacitor charges for a time independent from the duration of the injection pulses.

2. A circuit for energizing a fuel injector valve coil in response to fuel injection pulses to provide measured amounts of fuel to an internal combustion engine, the circuit comprising:

a storage capacitor;

a charging circuit including a relatively high voltage source and a first switch means in series effective to charge the storage capacitor;

a capacitor discharge circuit, the discharge circuit including a second switch means responsive to the initiation of a fuel injection pulse effective to discharge the capacitor through the injector valve coil to affect abrupt injection valve opening and also effective to terminate capacitor discharge when the capacitor discharge current decreases to a predetermined value which is reached after valve opening occurs;

means including a reactive timing element responsive to the initiation of the fuel injection pulse effective to control the first switch means to disable the charging circuit for a predetermined time period required for the capacitor discharge current to decrease to said predetermined value at which the capacitor discharge is terminated, the charging circuit being effective after said predetermined time period to activate capacitor charging; and a holding circuit responsive to the injection pulse effective to maintain the injector coil energized for the duration of the injection pulse, the holding circuit comprising a low voltage source, a unidirectional conducting element, and a third switch means responsive to the fuel injection pulse effective to couple the low voltage source across the injector coil for the duration of the fuel injection pulse signal, the unidirectional conducting element being effective to prevent the capacitor from discharging into the low voltage source when the capacitor is discharged by the second switch means, the injector coil being deenergized upon termination of the fuel injection pulse to effect injection valve closing, the charging capacitor having a charging time independent from the energization of the injector coil so that the charging time is independent from the duration of the injection pulses.

3. A circuit for energizing a fuel injector valve coil in response to fuel injection pulses to provide measured amounts of fuel to an internal combustion engine, the circuit comprising:

a storage capacitor;

a charging circuit effective to charge the storage capacitor to a specified relatively high voltage level;

a gate controlled rectifier effective when gated conductive to couple the charge of the capacitor across the injector valve coil;

means including a reactive timing element responsive to the initiation of a fuel injection pulse effective to (A) gate the controlled rectifier conductive to discharge the capacitor through the injector valve coil to cause abrupt energization thereof to initiate delivery of fuel to the internal combustion engine and (B) disable the charging circuit for a predetermined time period required for the capacitor discharge to decrease to a level effective to commutate the controlled rectifier, the charging circuit being effective after said predetermined time period to reinstate capacitor charging; and a holding circuit responsive to the injection pulse effective to maintain the injector valve coil energized for the duration of the injection pulse, the holding circuit comprising a low voltage source, a unidirectional conducting element, and a switch means responsive to the fuel injection pulse signal effective to couple the low voltage source across the injector valve coil for the duration of the injection pulse signal, the unidirectional conducting element being effective to prevent the capacitor from discharging into the low voltage source when the controlled rectifier is gated conductive, the reinstatement of the capacitor charging being independent from the energization of the injector valve coil by the holding circuit so that the charging duration of the capacitor is independent from the duration of the injection pulses.

* * * * *